US009855575B2

(12) United States Patent
Huang et al.

(10) Patent No.: US 9,855,575 B2
(45) Date of Patent: Jan. 2, 2018

(54) GAS INJECTOR AND COVER PLATE ASSEMBLY FOR SEMICONDUCTOR EQUIPMENT

(71) Applicant: HERMES-EPITEK CORPORATION, Taipei (TW)

(72) Inventors: Tsan-Hua Huang, Tainan (TW); Tsung-Hsun Han, Kaohsiung (TW); Paul Wong, Johor (MY); Miao-Chan Wu, Kaohsiung (TW)

(73) Assignee: HERMES-EPITEK CORPORATION, Taipei (TW)

( * ) Notice: Subject to any disclaimer, the term of this patent is extended or adjusted under 35 U.S.C. 154(b) by 65 days.

(21) Appl. No.: 15/145,995

(22) Filed: May 4, 2016

(65) Prior Publication Data

US 2016/0244876 A1     Aug. 25, 2016

Related U.S. Application Data

(63) Continuation of application No. 14/186,429, filed on Feb. 21, 2014, now Pat. No. 9,427,762.

(30) Foreign Application Priority Data

Feb. 23, 2013  (TW) .............................. 102106341 A

(51) Int. Cl.
 *B05B 1/24* (2006.01)
 *B05B 15/02* (2006.01)
 *C23C 16/44* (2006.01)
 *C23C 16/455* (2006.01)

(52) U.S. Cl.
 CPC .......... *B05B 15/02* (2013.01); *C23C 16/4401* (2013.01); *C23C 16/455* (2013.01); *C23C 16/45565* (2013.01); *C23C 16/45572* (2013.01); *C23C 16/45574* (2013.01)

(58) Field of Classification Search
 CPC ... B05B 15/02; C23C 16/4401; C23C 16/455; C23C 16/45565; C23C 16/45572; C23C 16/45574
 USPC ................................................ 239/128, 590.3
 See application file for complete search history.

(56) References Cited

U.S. PATENT DOCUMENTS

| 5,453,124 | A | * | 9/1995 | Moslehi ............ C23C 16/45561 |
| | | | | 118/715 |
| 5,558,717 | A | | 9/1996 | Zhao et al. |
| 6,309,465 | B1 | | 10/2001 | Jurgensen et al. |
| 6,379,466 | B1 | | 4/2002 | Sahin et al. |

(Continued)

*Primary Examiner* — Arthur O Hall
*Assistant Examiner* — Adam J Rogers
(74) *Attorney, Agent, or Firm* — Huffman Law Group, PC

(57) ABSTRACT

The invention provides a gas injector and cover plate assembly comprising a cover plate, a gas injector and a ceiling. The cover plate comprises a plurality of cooling fluid channels. The gas injector is configured to be located on the cover plate comprising a gas distributor, a fluid-cooling gas transmitter, a plurality of gas spraying plates and a conducting cone. The gas distributor distributes a plurality of gases and a gas transmitter cooling fluid. The gas distributor comprises a gas conduit for introducing a first gas. The fluid-cooling gas transmitter connects the gas distributor to introduce the gas transmitter cooling fluid to form a plurality of cooling fluid walls and the first gas and the gases. The gas spraying plates and the conducting cone are located beneath the fluid-cooling gas transmitter.

20 Claims, 11 Drawing Sheets

(56) References Cited

U.S. PATENT DOCUMENTS

| | | |
|---|---|---|
| 6,626,998 B1 | 9/2003 | Dunham |
| 6,786,973 B2 | 9/2004 | Strauch et al. |
| 7,033,921 B2 | 4/2006 | Jurgensen |
| 7,083,702 B2 | 8/2006 | Blonigan et al. |
| 7,128,785 B2 | 10/2006 | Kaeppeler et al. |
| 7,147,718 B2 | 12/2006 | Jurgensen et al. |
| 7,294,207 B2 | 11/2007 | Strauch et al. |
| 8,074,599 B2 | 12/2011 | Choi et al. |
| 8,328,939 B2 | 12/2012 | Choi et al. |
| 8,357,435 B2 | 1/2013 | Lubomirsky et al. |
| 8,709,162 B2 | 4/2014 | Leung et al. |
| 8,778,079 B2 * | 7/2014 | Begarney ............ C23C 16/45508 118/715 |
| 2001/0047764 A1 * | 12/2001 | Cook .................... C23C 16/44 118/730 |
| 2004/0013800 A1 | 1/2004 | Strauch et al. |
| 2004/0231599 A1 | 11/2004 | Schwambera et al. |
| 2009/0064935 A1 | 3/2009 | Dauelsberg et al. |
| 2011/0146571 A1 | 6/2011 | Bartlett et al. |
| 2011/0237051 A1 | 9/2011 | Hess et al. |
| 2013/0180454 A1 * | 7/2013 | Park ................. C23C 16/45508 118/728 |
| 2014/0284404 A1 * | 9/2014 | Kuah ............... C23C 16/45565 239/408 |
| 2015/0240361 A1 * | 8/2015 | Madrigal .......... C23C 16/45561 438/5 |
| 2015/0246845 A1 * | 9/2015 | Seki .................... C03C 17/245 427/255.18 |

* cited by examiner

GAS INJECTOR AND COVER PLATE ASSEMBLY FOR SEMICONDUCTOR EQUIPMENT

CROSS-REFERENCE TO RELATED APPLICATIONS

This application is a continuation application of U.S. application Ser. No. 14/186,429, filed on Feb. 21, 2014 and entitled Gas Injector and Cover Plate Assembly for Semiconductor Equipment, which claims the priority benefit of Taiwan Patent Application No. 102106341, filed on Feb. 23, 2013, the entire contents of which are incorporated herein by reference.

BACKGROUND OF THE INVENTION

1. Field of the Invention

The present invention generally relates to a gas injector and a cover plate assembly applied in a semiconductor equipment, and more particularly to a temperature-controllable cover plate assembly and a detachable gas injector thereon.

2. Description of the Related Art

In thin film deposition process, the temperature of the lower surface of a ceiling attached on a cover plate must be controlled at about 300° C. in order to avoid the accumulation of particles on the lower surface of the ceiling and the subsequently dropping of the particles on a wafer in manufacturing process and poor yield ratio of production. The temperature of the lower surface of the ceiling depends on the combination arrangement and cooling methods between the cover plate and the ceiling.

In the thin film growth process, reaction gases are horizontally injected above a susceptor by a gas injector to be mixed, and films are then deposited on a wafer through physical or chemical reactions induced by heating. The injector is designed to horizontally inject the reaction gases and render the reaction gases uniformly distributed on the surface of the rotating susceptor so as to form a uniform boundary layer on the surface of the susceptor to facilitate the deposition of thin films. In addition, the spacing and angle of injector outlets also have a decisive influence on process result.

Conventional cover plate is a single-layer structure with direct water cooling. A space is between a ceiling attached on the cover plate and the cover plate for introducing a gas mixture of gases with different flow rate to control the temperature of the lower surface of the ceiling in order to prevent accumulation of particles in the process attached to the lower surface of the ceiling and the subsequently dropping of the particles on a wafer in manufacturing process so as to degrade yield ratio of production. This design must use hydrogen (H2), nitrogen (N2) and the mass flow controller (MFC) to adjust different gas combinations and different flow rates of gas, and uniformly maintain the distance between the ceiling and the cover plate at 0.1 mm, to facilitate flow uniformity of the gas combination and to achieve uniformity of temperature.

Conventional injectors horizontally inject reaction gases above a susceptor in a chamber in a thin film growth process, the gases mix and deposit on a substrate to form a thin film through physical or chemical reactions induced by heating. One-piece injector is formed by combining multiple components via brazing with disadvantages of lower yield rate and easy leakage of cooling water due to cloggy narrow fluid conduit rendering it necessary to replace the entire injector. Moreover, the pitch between outlets of the injector is fixed unable to be adjusted which will limit the adjustments of parameters such as flow speeds and flow field/distribution. The whole injector must be replaced in order to change flow speeds and flow field.

Therefore the invention provides a gas injector and cover plate assembly to prevent the accumulation of particles attached on the lower surface of a ceiling in the process, and to improve the production yield ratio, along with characteristics of adjustable flow velocities and flow field/distribution, and to facilitate the process development.

SUMMARY OF THE INVENTION

One object of the invention is to provide a two layer design of cover plate. wherein two fluids have different thermal conductivities and temperatures can be introduced into each layer respectively to adjust the temperature of the lower surface of a ceiling attached on the cover plate via thermal conduction to prevent accumulation of particles on the lower surface of the ceiling and the subsequently dropping of the particles on a wafer during deposition process to improve yield ratio.

The gas injector comprises a plurality of components comprising a gas distributor, a fluid-cooling gas transmitter, a plurality of gas spraying plates and a conducting cone. The gas injector is designed as a porous showerhead for uniform distribution of gas. The fluid-cooling gas transmitter can be replaced to save cost if the fluid-cooling gas transmitter leaks due to repeatedly heating. A newly designed gas spraying plate can be used to replace the original gas spraying plate without replacing the whole gas injector if the pitch between adjacent gas spraying plates needs to be adjusted. Thus the gas injector of the invention has advantages of new functions, lower cost and easy maintenance.

The temperature adjustable cover plate comprises two-layers cooling fluid channels each with independent temperature control to adjust the temperature of the ceiling. The gas injector with a detachable structure comprises a gas distributor, a fluid-cooling gas transmitter, a plurality of gas spraying plates and a conducting cone. The gas injector is able to adjust pitches between the gas spraying plates and incline angles of the gas spraying plates so as to adjust flow speeds and flow field of gases and to facilitate process development.

In one embodiment of the invention, the invention provides a gas injector and cover plate assembly comprising a cover plate, a gas injector and a ceiling. The cover plate comprises a plurality of cooling fluid channels. The gas injector attached to the cover plate comprising a gas distributor, a fluid-cooling gas transmitter, a plurality of gas spraying plates and a conducting cone. The gas distributor uniformly distributes a plurality of gases and cooling fluids, the gas distributor comprises a gas conduit through the gas distributor for introducing a first gas. The fluid-cooling gas transmitter connects the gas distributor and introduces the first gas, the gases and the cooling fluids to form a plurality of cooling fluid walls. Independent channels introduce the cooling fluids to form a plurality of cooling fluid walls. The first gas channel connects the gas conduit. The gas channels introduces the gases. The independent channels are between the two adjacent gas channels, and outside the gas channels. A plurality of gas spraying plates and a conducting cone are sequentially located beneath the fluid-cooling gas transmitter, the two adjacent gas spraying plates change a flow direction of one of the gases, and the gas spraying plate and the conducting cone change a flow direction of the first gas.

The ceiling attaches to a surface of the cover plate and adjacent one side of the gas injector.

DETAILED DESCRIPTION

Embodiments of this invention will be described in detail below. However, in addition to as described below, this invention can be broadly implemented in the other cases the purpose and scope of this invention is not affected by the application of qualified, claim after its prevail. Furthermore, to provide a description clearer and easier to understand the invention, the pieces within the schema are not in accordance with their relative size of drawing, compared to certain dimensions of other scales have been exaggerated; details not related nor completely drawn in part in order to schematic simplicity.

One embodiment of the present invention is related to a deposition process system for a semiconductor equipment comprising a gas injector and cover plate assembly. The deposition process system comprises a reaction chamber enclosing a process space, a gas delivery apparatus and a gas processing apparatus with the gas injector and cover plate assembly. The deposition process system can be used in a thin film deposition process, such as a metal-organic chemical vapor deposition process. The gas injector and cover plate assembly are located above or at one side of the process space, while a substrate susceptor is located beneath the process space or at the other side of the process space. The substrate susceptor is utilized to sustain a substrate thereon for processing. Typical substrates loaded into the deposition process system for processing includes silicon wafer, sapphire substrate, silicon carbide substrate or gallium nitride or III-V group semiconductor substrates, etc. It is noted that other substrate such as glass substrates can also be loaded into the deposition process system for processing. It is also noted that any designs of reaction chamber enclosing a process space and gas delivery apparatus can be applied in the deposition process system and therefore will not be specifically described herein. The deposition process system can further include other devices or components which are well known for any one with ordinary skill in the art. However, components related to the gas injector and cover plate assembly will be further described in detail.

Figure 1:
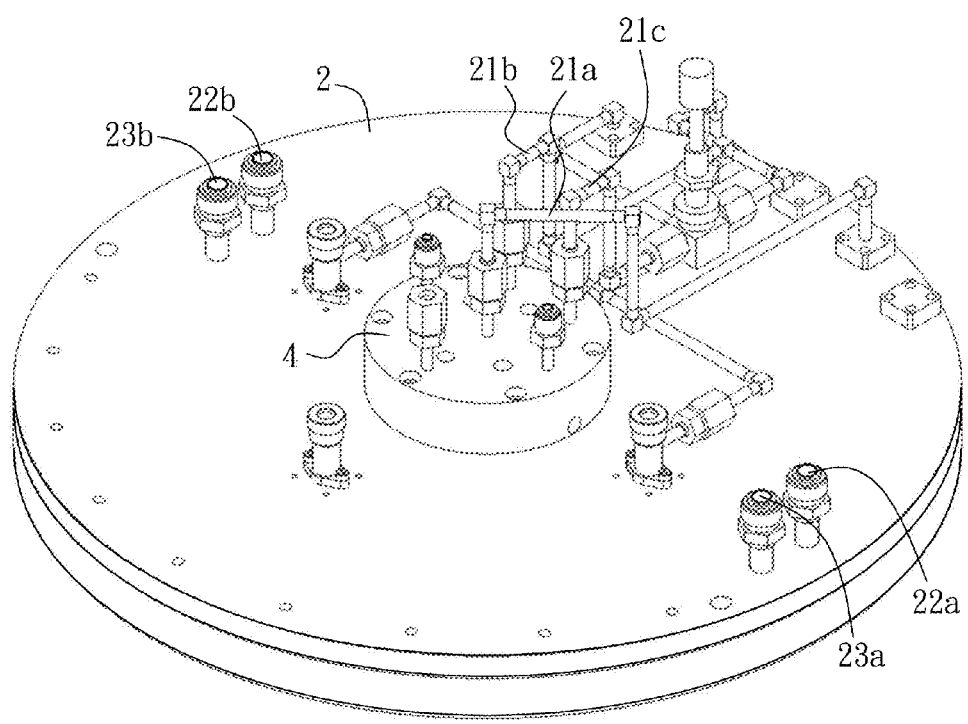
FIG. 1 shows a gas injector and cover plate assembly applied to a deposition process system for a semiconductor equipment according to one embodiment of the present invention.

FIG. 1 shows a gas injector and cover plate assembly applied to a deposition process system for a semiconductor equipment according to one embodiment of the present invention. The gas injector and cover plate assembly 1 is configured to be located above the reaction chamber and the substrate susceptor of the semiconductor equipment during thin film deposition process. in one embodiment of the invention, the gas injector and cover plate assembly 1 comprises a cover plate 2 and a gas injector 4. A first gas conduit 21a, a second gas conduit 21b and a third gas conduit 21c for introducing three types of gases into the gas injector 4 are also shown in FIG. 1. First cooling fluid inlet 22a and outlet 22b and second cooling fluid inlet 23a and outlet 23b for introducing two types of cooling fluids into and out from the cover plate 2 respectively are also shown in FIG. 1. The embodiments of the cover plate 2 and the gas injector 4 will be described in detail in the following content.

Figure 2:
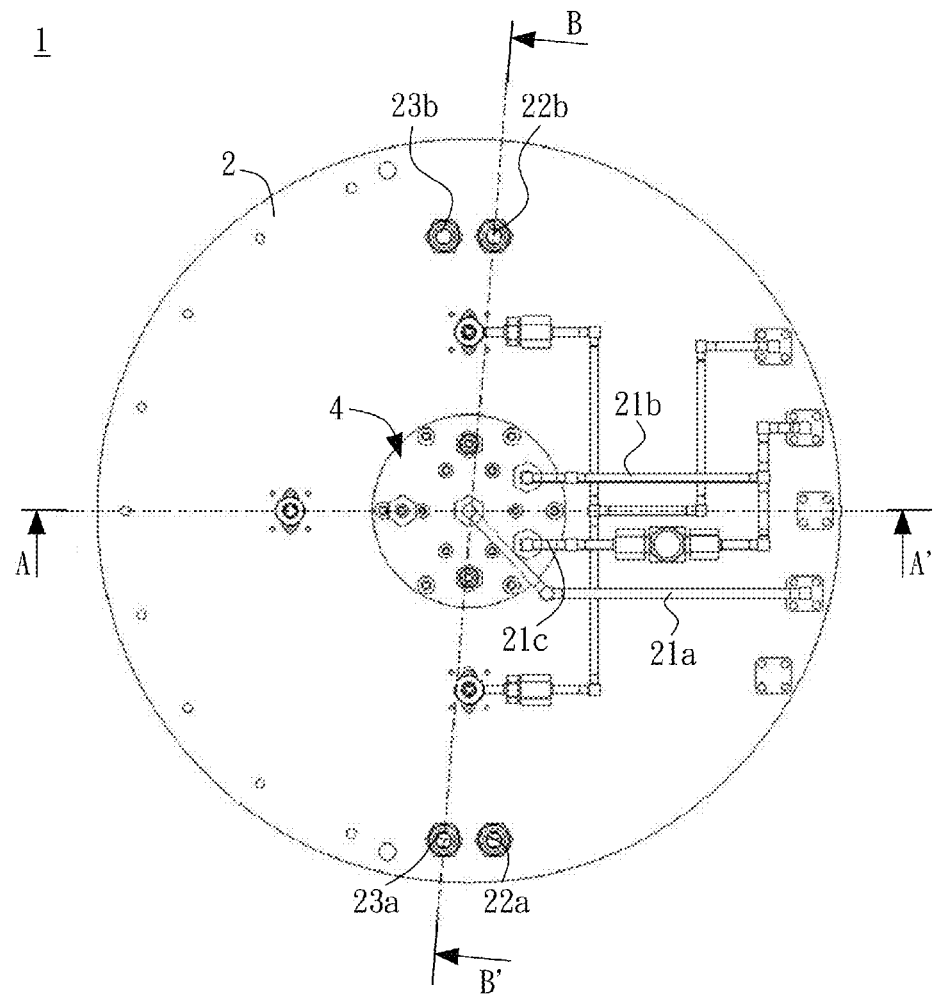
FIG. 2 is a top view of the gas injector and cover plate assembly applied to a deposition process system for a semiconductor equipment according to one embodiment of the present invention.
Figure 2A:
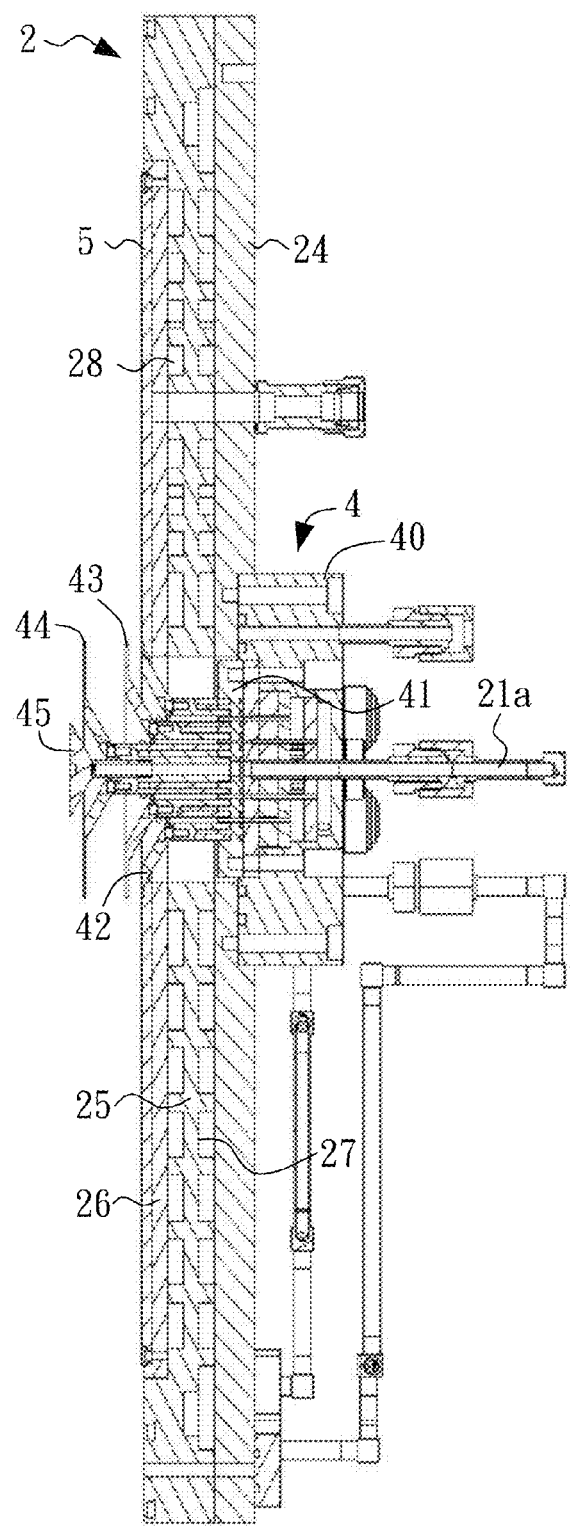
FIGS. 2A and 2B are cross sectional views of the gas injector and cover plate assembly in FIG. 2 along the directions of AA' and BB' respectively.
Figure 2B:
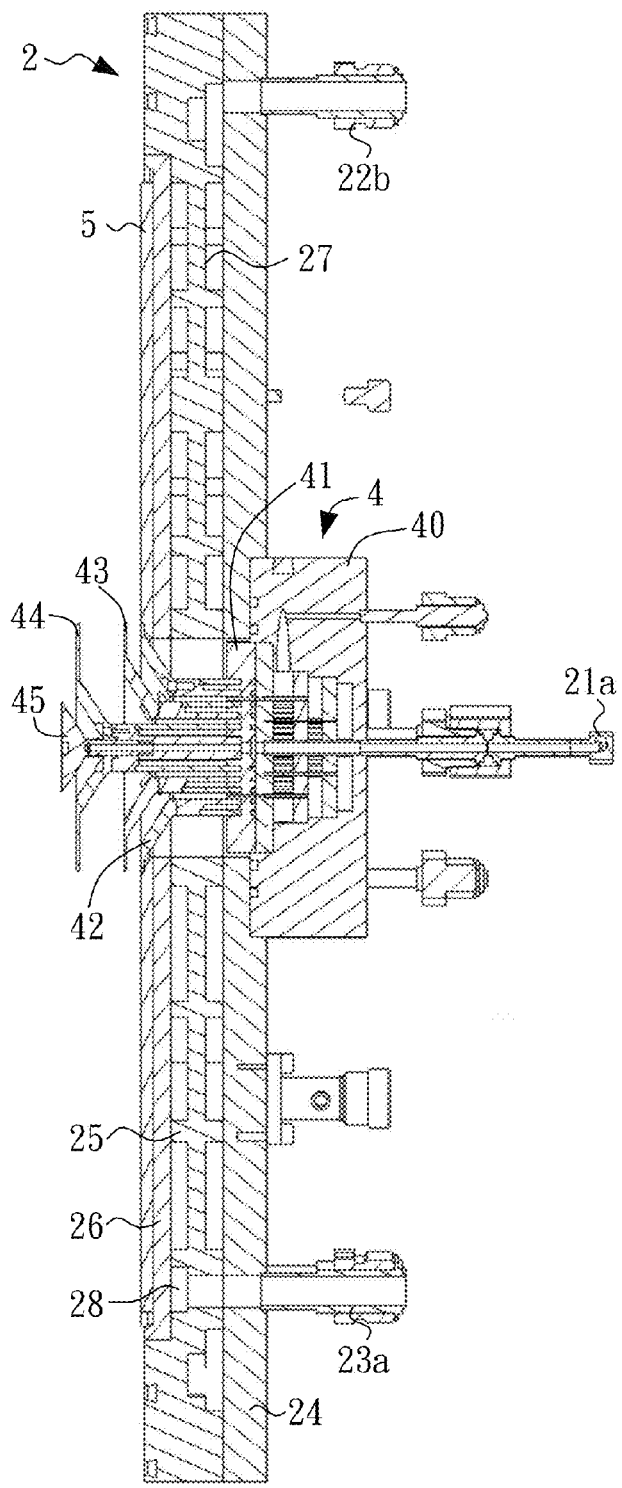

FIG. 2 is a top view of the gas injector and cover plate assembly applied to a deposition process system for a semiconductor equipment according to one embodiment of the present invention. FIGS. 2A and 2B are cross sectional views of the gas injector and cover plate assembly in FIG. 2 along the directions of AA' and BB' respectively. In one embodiment, as shown in the FIG. 2A, the cover plate 2 has a two-layer first cooling fluid channels 27 and 28. The first and second cooling fluid channels 27 and 28 are formed by an upper plate 24, a partition plate 25, a lower plate 26 and a ceiling 5. The material of the ceiling comprises quartz. The upper space formed by the upper plate 24 and the partition plate 25 is the first cooling fluid channel 27, while the lower space formed by the partition plate 25 and the lower plate 26 is the second cooling fluid channel 28. The first and second cooling fluid channels 27 and 28 comprise whirling cooling fluid channels. The first and second cooling fluid channels 27 and 28 can be used to introduce fluids with different thermal conductivities and temperatures, or same fluid with different temperatures respectively to form a high to low temperature gradient. The temperature of the ceiling 5 attached to the lower plate 26 of the cover plate 2 is adjusted via thermal conduction to prevent the accumulation of particles formed by reaction gases on the ceiling 5 and the subsequently dropping of the particles on the substrate such as a wafer during deposition process.

FIG. 2A also shows a structure of the gas injector 4 according to one embodiment of the present invention. In this embodiment, the gas injector 4 comprising a plurality of components has a function of horizontally injecting three layers of gases. The gas injector 4 comprises a gas distributor 40, a fluid-cooling gas transmitter 41, a first gas spraying plate 42, a second gas spraying plate 43, a third gas spraying plate 44 and a conducting cone 45. The gas distributor 40, the fluid-cooling gas transmitter 41, the first gas spraying plate 42, the second gas spraying plate 43, the third gas spraying plate 44 and the conducting cone 45 are sequentially mounted on the cover plate 2 to form the gas injector and cover plate assembly. The ceiling 5 is pressed by the edge of the first gas spraying plate 42 and is attached on the lower surface of the lower plate 26 of the cover plate 2 so as to be mounted on the cover plate 2. The ceiling can be secured on the cover plate 2 via screws on the circumference of the cover plate 2. The embodiment of the gas injector 4 will be described in detail in the following content.

FIG. 2B which is the cross sectional view of the gas injector and cover plate assembly in FIG. 2 along the direction of BB' shows that the second cooling fluid inlet 23a connects the second cooling fluid channel 28, and the first cooling fluid outlet 22b connects the first cooling fluid channel 27. Please refer to FIGS. 1, 2 and 2B, the first cooling fluid inlet 22a and the second cooling fluid inlet 23a are used to introduce two fluids with different thermal conductivities and temperatures into the first and second cooling fluid channels 27 and 28 of the cover plate 2. The fluids flow out from the cover plate 2 through the first cooling fluid outlet 22b and the second cooling fluid outlet 23b In one embodiment, during deposition process, the first cooling fluid with a lower temperature flows into the cover plate 2 via the first cooling fluid inlet 22a. The first cooling fluid then flows through the whirling first cooling fluid channel 27 to cool the partition plate 25 and to control thermal energy transmitting to the upper plate 24, and then flows out from the cover plate 2 via the first cooling fluid outlet 22b. The second cooling fluid with a higher temperature flows into the cover plate 2 via the second cooling fluid inlet 23a. The second cooling fluid then flows through the whirling second cooling fluid channel 28 to cool the lower plate 26 and to control thermal energy transmitting to the partition plate 25, and then flows out from the cover plate 2 via the second cooling fluid outlet 23b. Through the different thermal conductivities and temperatures of the first and second cooling fluids, the transmission of thermal energy during the deposition process can be controlled and the temperature of the ceiling 5 can be adjusted by controlling the thermal conduction so as to prevent the accumulation of particles formed by reaction gases on the ceiling 5 and the subsequently dropping of the particles on a processing substrate or a wafer during deposition process.

Figure 3:
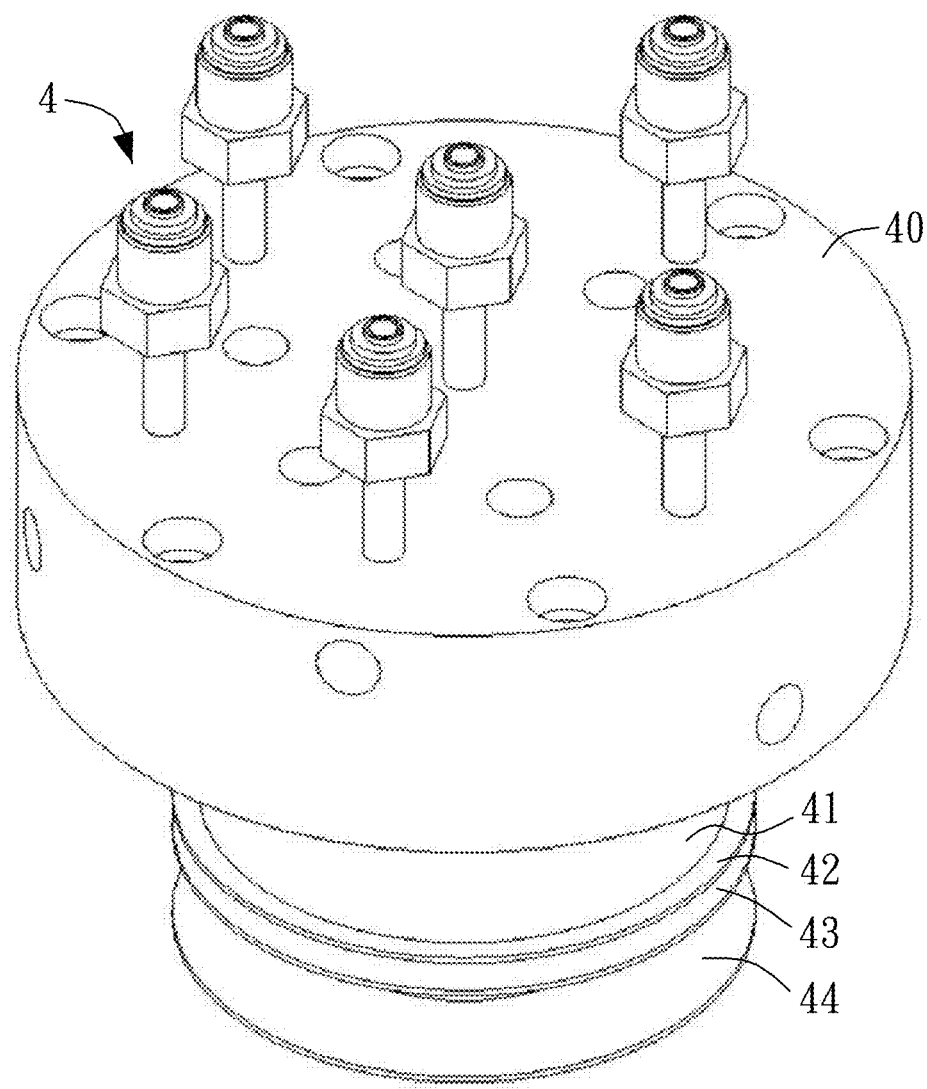
FIG. 3 shows a gas injector applied to a semiconductor equipment according to one embodiment of the present invention.
Figure 4:
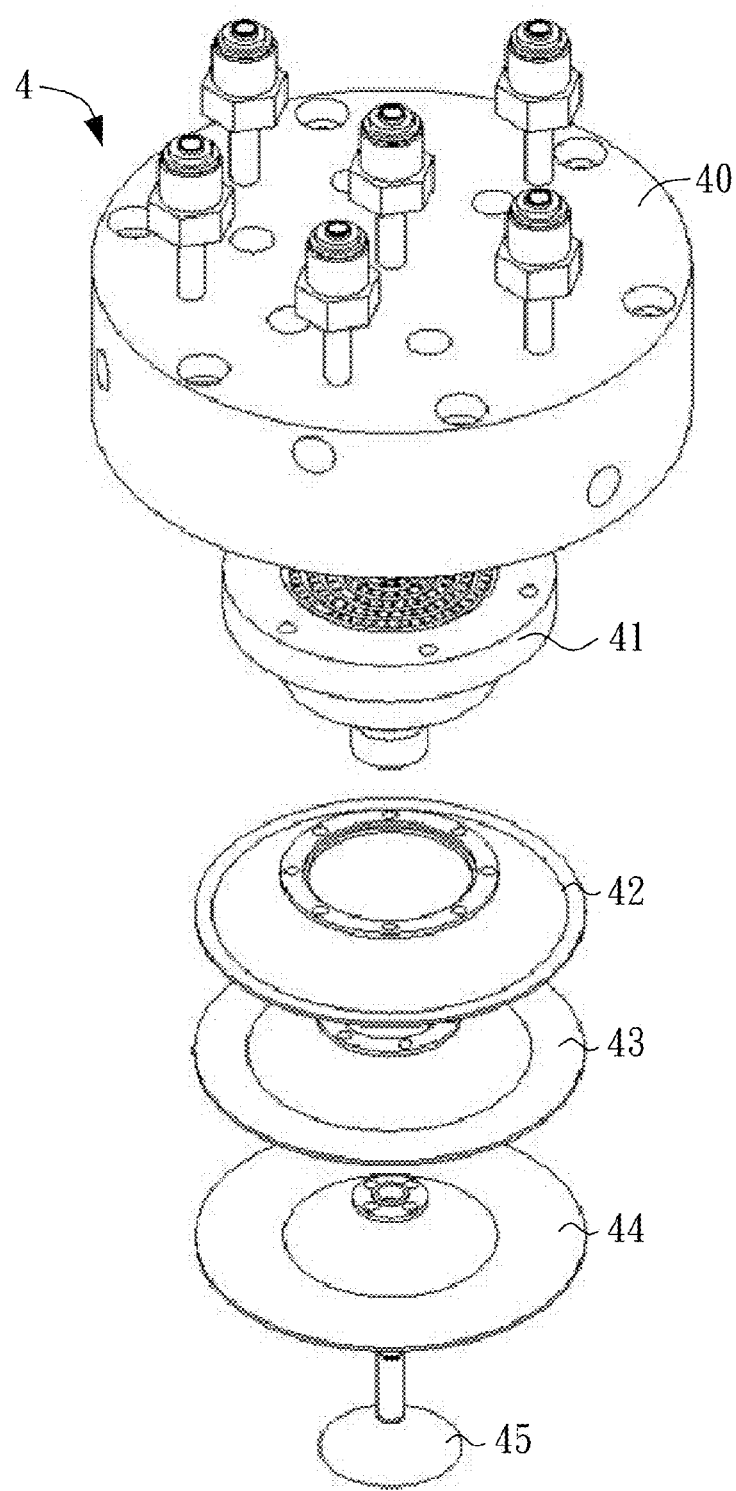
FIG. 4 is an exploded view of a gas injector applied to a semiconductor equipment according to one embodiment of the present invention.
Figure 5:
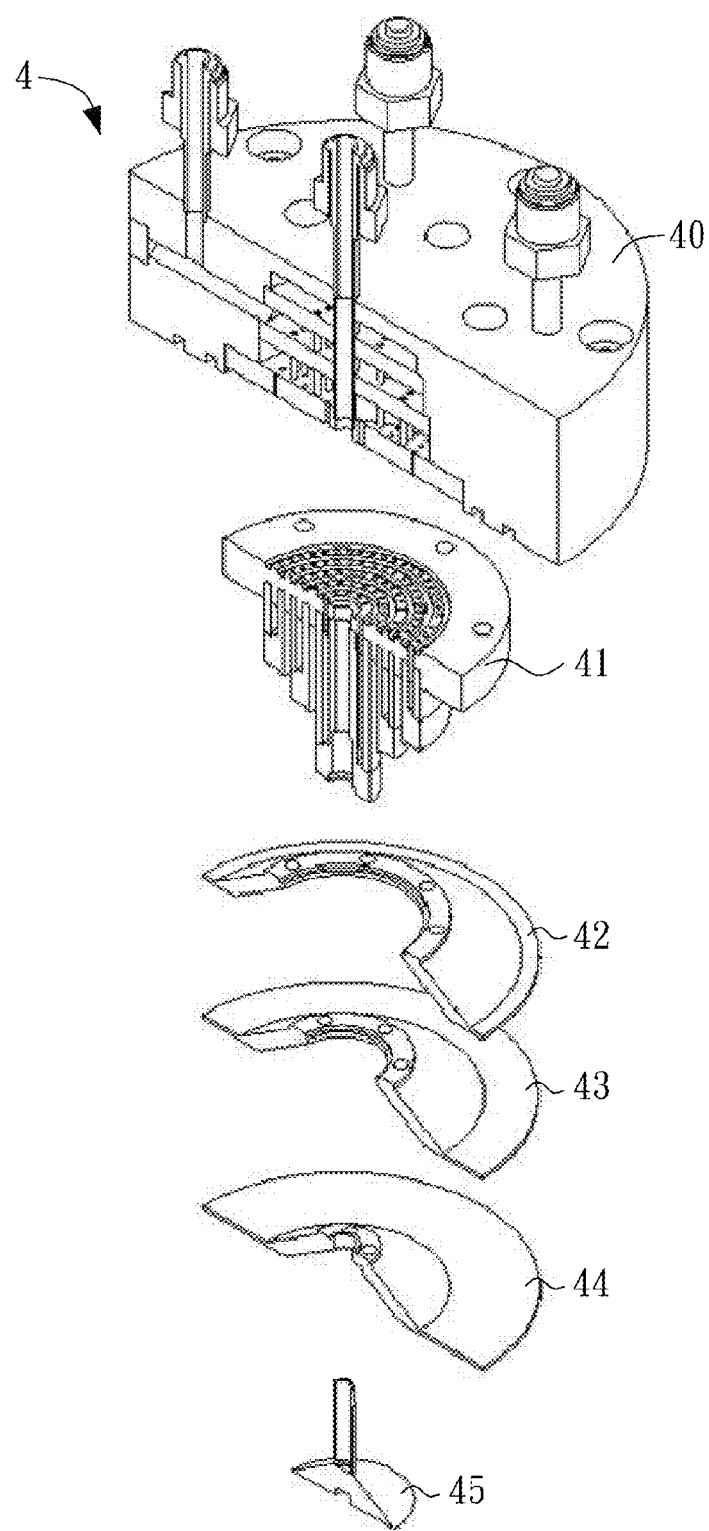
FIG. 5 is an exploded and cross sectional view of a gas injector applied to a semiconductor equipment according to one embodiment of the present invention.

FIG. 3 shows a gas injector applied to a semiconductor equipment according to one embodiment of the present invention. FIG. 4 is an exploded view of a gas injector applied to a semiconductor equipment according to one embodiment of the present invention. FIG. 5 is an exploded and cross sectional view of a gas injector applied to a semiconductor equipment according to one embodiment of the present invention. In one embodiment of the present invention, the gas injector 4 with a plurality of components comprising the gas distributor 40, the fluid-cooling gas transmitter 41, the first gas spraying plate 42, the second gas spraying plate 43, the third gas spraying plate 44 and the conducting cone 45. The embodiment of the gas injector 4 will be described in detail in the following content.

Figure 6:
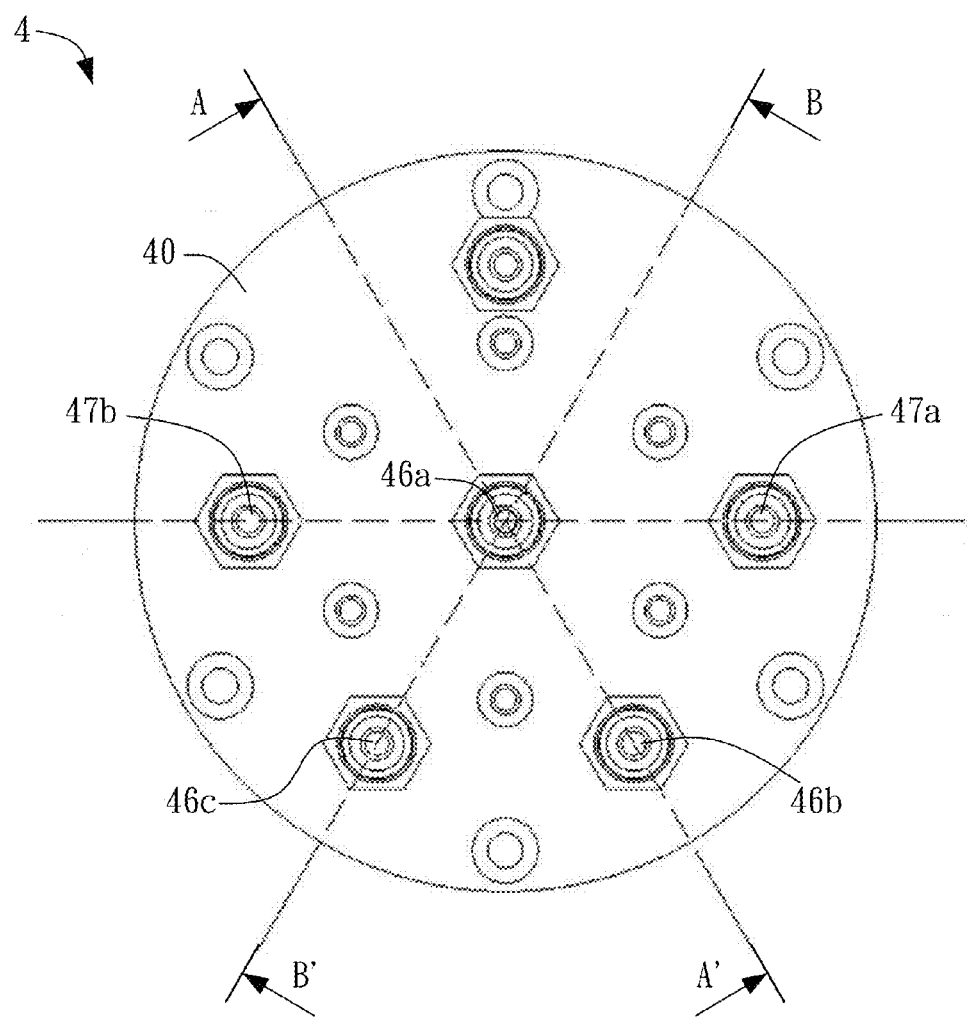
FIG. 6 is a top view of a gas injector according to one embodiment of the present invention.

FIG. 6 is a top view of a gas injector according to one embodiment of the present invention. FIG. 6 shows a first gas connector 46a, a second gas connector 46b and a third gas connector 46c for connecting the first gas conduit 21a, the second gas conduit 21b and the third gas conduit 21c in FIG. 1 respectively as well as cooling fluid connectors 47a and 47b.

Figure 6A:
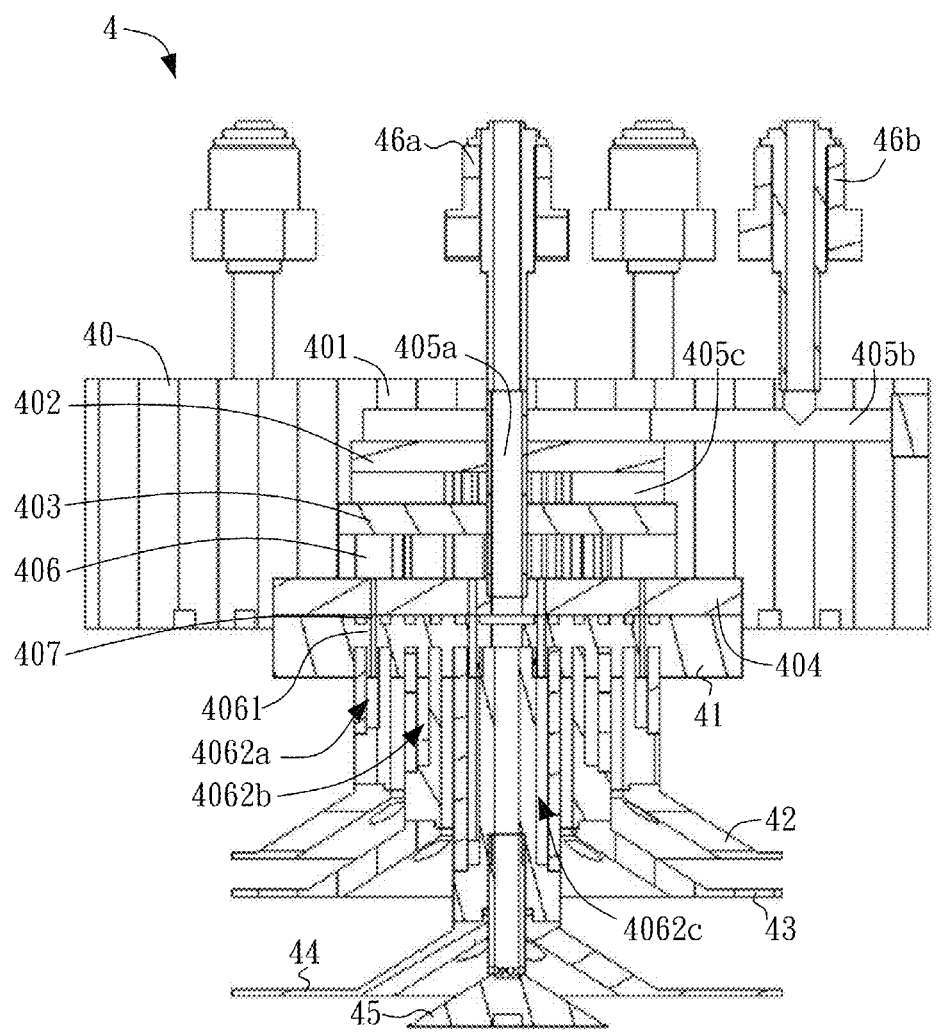
FIGS. 6A, 6B and 6C are cross sectional views of the gas injector in FIG. 6 along the directions of AA', BB' and CC' respectively.
Figure 6B:
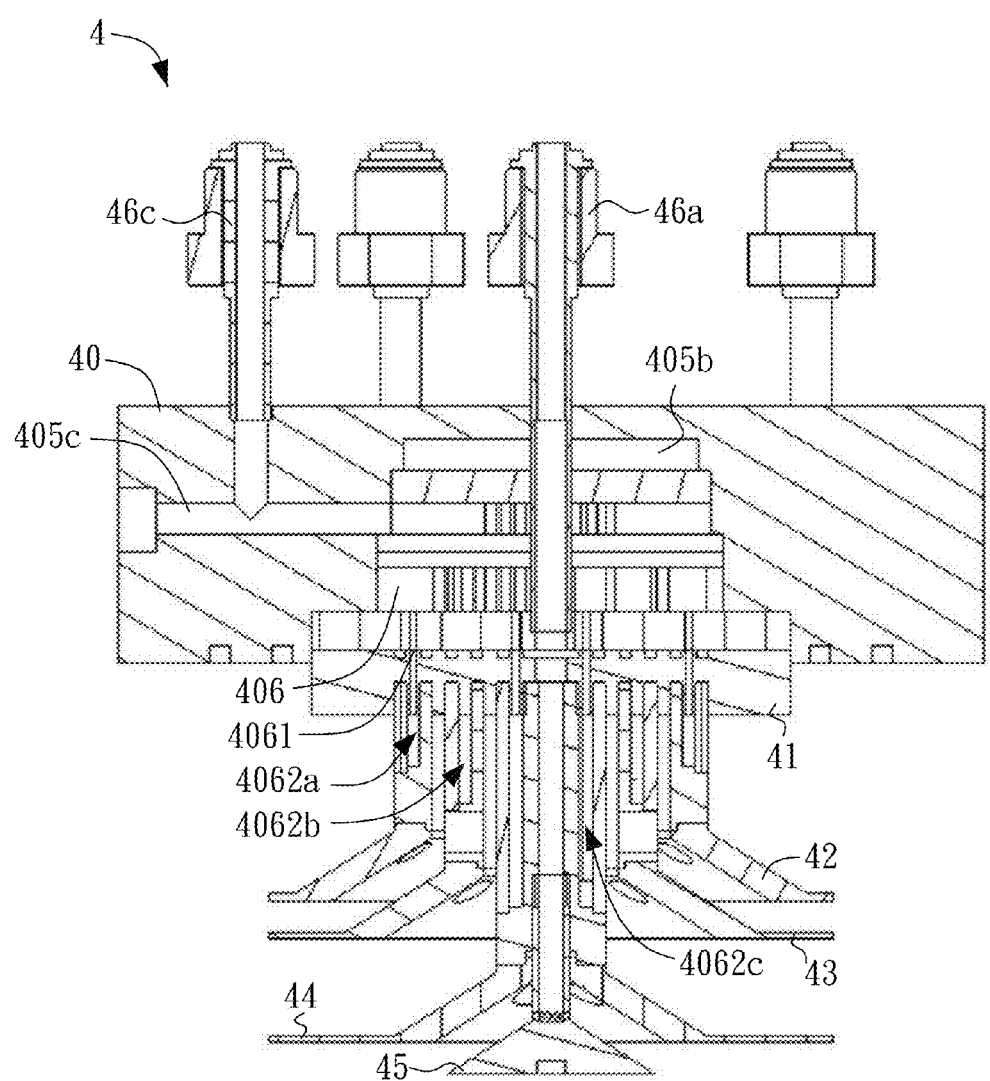
Figure 6C:
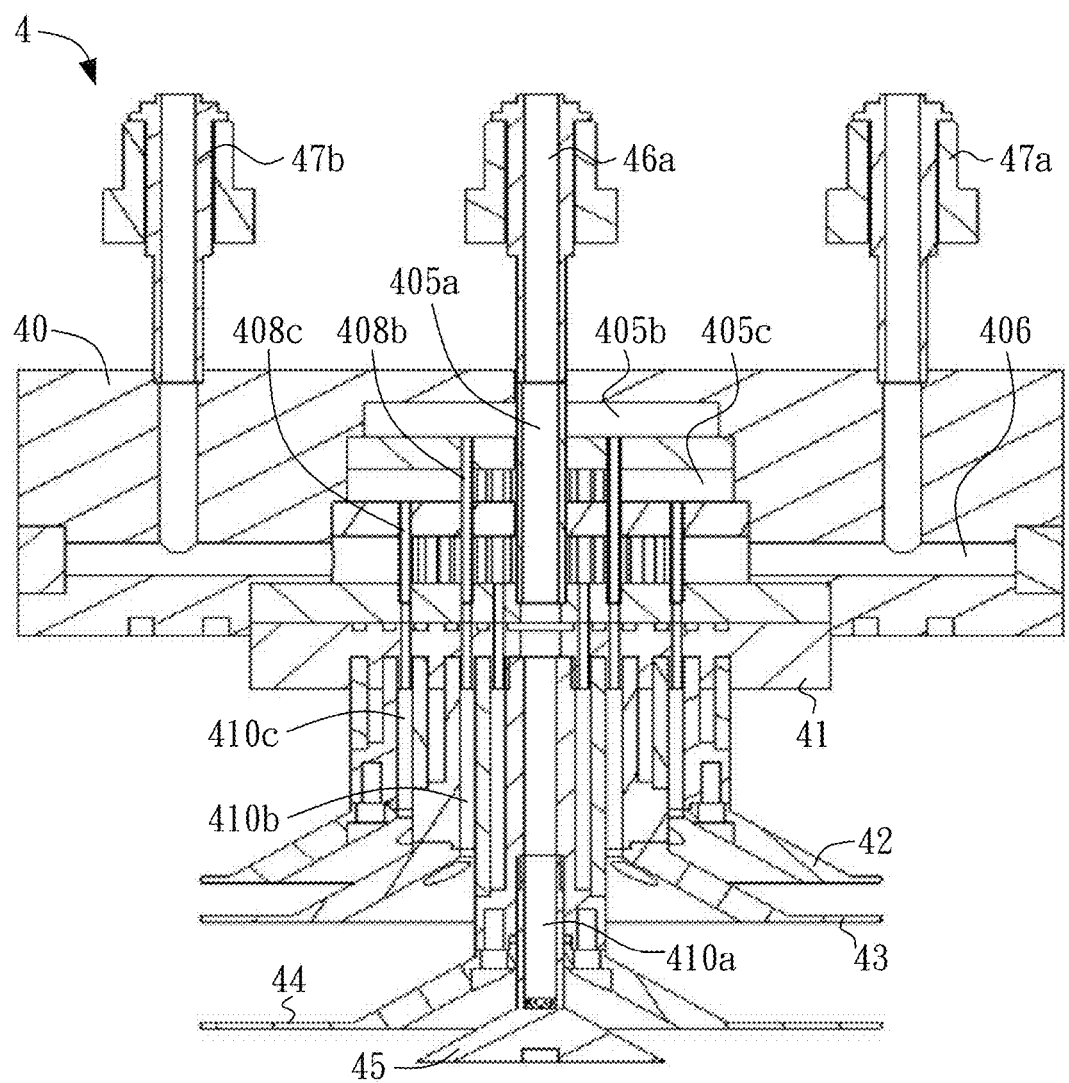

FIGS. 6A, 6B and 6C are cross sectional views of the gas injector in FIG. 6 along the directions of AA', BB' and CC' respectively. Please refer to FIG. 6A, in one embodiment of the present invention, the gas distributor 40 has a structure with three layers of space. A gas conduit 405a is located in the center of the gas distributor 40 for introducing a first gas from the first gas conduit 21a and the first gas connector 46a. The upper space is constituted by a housing 401 and a first partition 402 to form a second gas plenum 405b, and a second gas is introduced from the second gas connector 46b on the housing 401. The middle space is constituted by the first partition 402 and a second partition 403 to form a third gas plenum 405c, and a third gas is introduced from the third gas conduit 21c and the third gas connector 46c on the housing 401 (please referring to FIG. 6B). The lower space is constituted by the second partition 403 and a third partition 404 to form a fluid cooling plenum 406, and a cooling fluid is introduced from the cooling fluid connectors 47a and 47b on the housing 401 (please referring to FIG. 6C) and flows through the lower space. The first partition 402, the second partition 403 and the third partition 404 comprise gas or fluid spraying plates with porous single circle or multi-circles and uniform spraying function of showerhead.

In one embodiment of the present invention, the structure with three layers of space of the gas distributor 40 comprises the second gas plenum 405b, second conduits 408b secured by brazing, the third gas plenum 405c and third conduits 408c secured by brazing identical to a showerhead with three layers. The upper space of the gas distributor 40 is the second gas plenum 405b, and the bottom plate of the second gas plenum 405b is the first partition 402. The first partition 402 comprises a gas spraying plate with porous single circle or multi-circles. The middle space of the gas distributor 40 is the third gas plenum 405c, and the bottom plate of the third gas plenum 405c is the second partition 403. The second partition 403 comprises a gas spraying plate with porous single circle or multi-circles. The second conduits 408b are through holes of the first partition 402, the second partition 403 and the bottom plate of the fluid cooling plenum 406 or the third partition 404. These three through interfaces can be sealed by brazing. The third conduits 408c are through holes of the second partition 403 and the third partition 404. These two through interfaces can be sealed by brazing.

In one embodiment of the invention, the second conduit 408b and the third conduit 408c extend into or connect second gas channels 410b and third gas channels 410c of the fluid-cooling gas transmitter 41. A second gas can be uniformly distributed via the first partition 402 and the second conduit 408b and then flows downward through the second gas channels 410b of the fluid-cooling gas transmitter 41, and flows horizontally from the space between the second gas spraying plate 43 and the third gas spraying plate 44. A third gas can be uniformly distributed via the second partition 403 and the third conduit 408c and then flows downward through the third gas channels 410c of the fluid-cooling gas transmitter 41, and flows horizontally from the space between the first gas spraying plate 42 and the second gas spraying plate 43. The gas conduit 405a of the gas distributor 40 is a pass way for a first gas and connects a first gas channel 410a of the fluid-cooling gas transmitter 41 below. The top portion of the conducting cone 45 connecting the first gas channel 410a has a plurality of openings with a function similar to that of a gas spraying plate. A first gas flows downward through the first gas channels 410a of the fluid-cooling gas transmitter 41 via the gas conduit 405a of the gas distributor 40, and flows horizontally from the space between the third gas spraying plate 44 and the conducting cone 45. The gases in the second gas plenum 405b and the third gas plenum 405c flow downward via the second conduit 408b and the third conduit 408c respectively without mixing.

In one embodiment of the invention, a cooling fluid flows downward to one side of a plurality of cooling fluid walls 4062a~4062c of the fluid-cooling gas transmitter 41 via a plurality of independent channels 4061 at one side of the fluid cooling plenum 406. The cooling fluid then flows around a circle to the other side of the fluid cooling plenum 406, and then flows out through the cooling fluid connectors 47a and 47b (please referring to FIG. 6C). As mentioned above, the cooling fluid in the cooling fluid walls 4062a~4062c of the fluid-cooling gas transmitter 41 flows into the fluid-cooling gas transmitter 41 through the openings of the fluid cooling plenum 406 of the gas distributor 40 which are the openings of the connection between the independent channels 4061 and the third partition 404. The independent channels 4061 are between the first gas channels 410a and the second gas channels 410b, and between the second gas channels 410b and the third gas channels 410c. The cooling fluid wall 4062c is between the first gas channels 410a and the second gas channels 410b. The cooling fluid wall 4062b is between the second gas channels 410b and the third gas channels 410c. The cooling fluid wall 4062a is between the third gas channels 410c and the housing of the fluid-cooling gas transmitter 41. A plurality of O rings 407 can be used to seal the connection between the third partition 404 of the gas distributor 40 and the fluid-cooling gas transmitter 41 so as to facilitate vertical flow of gases and cooling fluid and lateral isolation of fluids to avoid leakage of fluids. The end of the independent channels 4061 toward the fluid cooling plenum 406 is at the same level with the third partition 404. The fluid-cooling gas transmitter 41 can be formed by inserting processed plates into trenches of an upper plate and connecting by brazing. The fluid-cooling gas transmitter 41 can be secured on the gas distributor 40 by screws.

In FIG. 6B which is the cross sectional view of the gas injector in FIG. 6 along the direction of BB', a third gas is introduced into the third gas plenum 405c through the third gas conduit 21 c and the third gas connector 46c on the housing 401, and then flows to the fluid-cooling gas transmitter 41 via the uniform distribution of the second partition 403 of the gas distributor 40.

In FIG. 6C which is the cross sectional view of the gas injector in FIG. 6 along the direction of CC', beside the gas conduit 405a for introducing the first gas from the first gas conduit 21a and the first gas connector 46a to the conducting cone 45, the second conduit 408b and the third conduit 408c in the gas distributor 40 for introducing the second and third gases from the second gas plenum 405b and the third gas plenum 405c to the gas distributor 40 are also shown. The second conduit 408b can be mounted in the first partition 402, the second partition 403 and the third partition 404 by brazing to introduce the second gas in the second gas plenum 405b to the second gas channels 410b of the fluid-cooling gas transmitter 41 and then the second gas can flow horizontally from the space between the second gas spraying plate 43 and the third gas spraying plate 44. The third conduit 408c can be mounted in the second partition 403 and the third partition 404 by brazing to introduce the third gas in the third gas plenum 405c to the third gas channels 410c of the fluid-cooling gas transmitter 41 and then the third gas can flow horizontally from the space between the first gas spraying plate 42 and the second gas spraying plate 43. The gas conduit 405a of the gas distributor 40 and the first gas channels 410a of the fluid-cooling gas transmitter 41 constitute an independent tubulous space to introduce the first gas from the first gas connector 46a on the housing 401 of the gas distributor 40 to the space between the third gas spraying plate 44, the conducting cone 45 and a substrate susceptor through the gas conduit 405a of the gas distributor 40 and the first gas channels 410a of the fluid-cooling gas transmitter 41, and the first gas flows horizontally from the space between the third gas spraying plate 44, the conducting cone 45 and the substrate susceptor. The bottom surface of the conducting cone 45 is at the same level with the upper surface of the substrate susceptor. The housing 401, the first partition 402, the second partition 403, the third partition 404, the second conduit 408b and the third conduit 408c are secured by brazing to prevent gas leakage.

In one embodiment of the invention, the first gas spraying plate 42, the second gas spraying plate 43, the third gas spraying plate 44 and the conducting cone 45 are components used for changing gas flow direction. The first gas spraying plate 42, the second gas spraying plate 43, the third gas spraying plate 44 and the conducting cone 45 comprise gas spraying plates with an inverted cone shape having a disc circular edge, and gas spraying plates with an inverted bowl shape having a curvature, or gas spraying plates with a hollow center and a gradually increased thickness from the center to the circumference. The circumference edges of the first gas spraying plate 42, the second gas spraying plate 43 and the third gas spraying plate 44 have holes for using fasteners such as screws to secure the first gas spraying plate 42, the second gas spraying plate 43 and the third gas spraying plate 44 beneath the cooling fluid walls 4062a~4062c of the fluid-cooling gas transmitter 41 to form a structure for altering gas flow direction. The combination of the first gas spraying plate 42 and the second gas spraying plate 43 is to change downward flow of the third gas to horizontal flow. The combination of the second gas spraying plate 43 and the third gas spraying plate 44 is to change downward flow of the second gas to horizontal flow. The combination of the third gas spraying plate 44 and the conducting cone 45 together with the substrate susceptor is to change downward flow of the first gas to horizontal flow. The first gas spraying plate 42, the second gas spraying plate 43, the third gas spraying plate 44 and the conducting cone 45 can be secured on the fluid-cooling gas transmitter 41 via screws.

In one embodiment of the invention, the pitch and the incline angle between the first gas spraying plate 42 and the second gas spraying plate 43 are adjustable to alter the height of fluid wall and the structures of the first gas spraying plate 42 and the second gas spraying plate 43 since the first gas spraying plate 42, the second gas spraying plate 43, the third gas spraying plate 44 and the conducting cone 45 can be secured by screws. The pitch and the incline angle between the second gas spraying plate 43 and the third gas spraying plate 44 are also adjustable to change the height of fluid wall and the structures of the second gas spraying plate 43 and the third gas spraying plate 44. The pitch and the incline angle between the third gas spraying plate 44 and the conducting cone 45 are also adjustable to change the height of the first gas channels 410a and the structures of the third gas spraying plate 44 and the conducting cone 45.

In one embodiment of the invention, the bottom of the first gas spraying plate 42 is at the same level with the bottom of the ceiling 5. The conducting cone 45 comprises a cone, wherein the outer diameter of the first gas channels 410a is slightly smaller than the inner diameter of the gas conduit 405a, and the first gas channels 410a is secured inside the gas conduit 405a. The top portion of the conducting cone 45 connecting the first gas channels 410a has a plurality of openings with a function similar to that of a uniform distribution plate with a porous structure.

In one embodiment of the invention, the conducting cone 45, the third gas spraying plate 44 and the substrate susceptor form a structure for altering flow direction of the first gas. The bottom surface of the conducting cone 45 is at the same level with the upper surface of the substrate susceptor. The first gas can flow downward through the first gas channels 410a via the openings, and flow out horizontally from the space between the third gas spraying plate 44 and the substrate susceptor.

In the embodiments set forth, the cover plate with the first and second cooling fluid channels 27 and 28 for introducing fluids with different thermal conductivities and temperatures is only one example of establishing a high to low temperature gradient. Hence the number and structure of cooling fluid channels in the cover plate are not limitations. Moreover, the gas plenums formed by the partitions relating to the number of gases to be introduced are not limited to the embodiment set forth either. Furthermore, the arrangement, shape and structure of the first gas spraying plate 42, the second gas spraying plate 43, the third gas spraying plate 44 and the conducting cone 45 are also examples, not limitations. Beside incline angle and pitch, thickness and curvature of the first gas spraying plate 42, the second gas spraying plate 43 and the third gas spraying plate 44 are also adjustable features.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A gas injector and cover plate assembly for a process system with a process space, comprising:
    a cover plate comprising a plurality of cooling fluid channels for introducing a plurality of cooling fluids with different temperatures to form a temperature gradient; and
    a gas injector attached to the cover plate located above the process space, comprising:
        a gas distributor uniformly distributing a plurality of gases, the gas distributor comprising a gas conduit through the gas distributor for introducing a first gas;
        a fluid-cooling gas transmitter connecting the gas distributor comprising:
            a plurality of independent channels for introducing the cooling fluids to form a plurality of cooling fluid walls;
            a first gas channel connecting the gas conduit; and
            a plurality of gas channels for introducing the gases;
            wherein the independent channels being between the two adjacent gas channels, and outside the gas channels; and
        a plurality of gas spraying plates and a conducting cone being sequentially located beneath the fluid-cooling gas transmitter, the two adjacent gas spraying plates changing a flow direction of one of the gases, and the gas spraying plate and the conducting cone changing a flow direction of the first gas.

2. The gas injector and cover plate assembly of claim 1 further comprising a ceiling attached to a surface of the cover plate and adjacent one side of the gas injector.

3. The gas injector and cover plate assembly of claim 2, wherein the cooling fluid channel adjacent the ceiling introduces the cooling fluid with a highest temperature.

4. The gas injector and cover plate assembly of claim 1, wherein the cover plate further comprises
    an upper plate;
    a partition plate, a first cooling fluid channel being between the upper plate and the partition plate for introducing a first cooling fluid; and
    a lower plate, a second cooling fluid channel being between the partition plate and the lower plate for introducing a second cooling fluid.

5. The gas injector and cover plate assembly of claim 3, wherein a temperature of the second cooling fluid is higher than that of the first cooling fluid.

6. The gas injector and cover plate assembly of claim 3, wherein the first and second cooling fluid channels comprise whirling cooling fluid channels.

7. The gas injector and cover plate assembly of claim 3, wherein the first and second cooling fluids have different thermal conductivities and temperatures, or the first and second cooling fluids are the same fluid with different temperatures respectively, to form a high to low temperature gradient.

8. The gas injector and cover plate assembly of claim 1, wherein the cooling fluids comprise a plurality of cooling fluids with different thermal conductivities.

9. The gas injector and cover plate assembly of claim 1, wherein the gas distributor further comprises:
    a housing and a plurality of partitions, each partition comprises a plurality of openings to uniformly distribute the gases and the cooling fluids, the gas conduit is through the housing, the partitions for introducing the first gas; and
    a plurality of conduits, each the conduit is in each the opening and through the partition for transmitting the gases.

10. The gas injector and cover plate assembly of claim 9, wherein the partitions comprise gas spraying plates with porous multi-circles.

11. The gas injector and cover plate assembly of claim 1, wherein the gas spraying plates comprise gas spraying plates each with a disc circular edge.

12. The gas injector and cover plate assembly of claim 1, wherein a bottom surface of the conducting cone is at the same level with an upper surface of a substrate susceptor.

13. The gas injector and cover plate assembly of claim 1, wherein a top portion of the conducting cone connecting the gas conduit has a plurality of openings.

14. A gas injector and cover plate assembly for a process system, comprising:
    a cover plate comprising a plurality of cooling fluid channels for introducing a plurality of cooling fluids with different temperatures to form a temperature gradient; and
    a gas injector attached to the cover plate located above the process space, comprising:
        a gas distributor, comprising:
            a second gas plenum formed by a housing and a first partition, the first partition comprising a plurality of first openings to uniformly distribute a second gas;
            a third gas plenum formed by a first partition and a second partition, the second partition comprising a plurality of second openings to uniformly distribute a third gas;
            a fluid cooling plenum formed by the second partition and a third partition, the third partition comprising a plurality of third openings to uniformly distribute the cooling fluids;
            a plurality of second conduits, each the second conduit being in each the first opening and through the first partition, the second partition and the third partition;

a plurality of third conduits, each the third conduit being in each the second opening and through the second partition and the third partition; and a gas conduit through the housing, the first partition, the second partition and the third partition for introducing a first gas;

a fluid-cooling gas transmitter comprising:

a plurality of independent channels, each the independent channel connecting each the third opening to introduce the cooling fluids and form a plurality of cooling fluid walls;

a first gas channel connecting the gas conduit;

a plurality of second gas channels, each the second gas channel connecting each the second conduit; and a plurality of third gas channels, each the third gas channel connecting each the third conduit;

wherein the independent channels being between the first gas channel and the second gas channels, and between the second gas channels and the third gas channels, and outside the third gas channels; and a first gas spraying plate, a second gas spraying plate, a third gas spraying plate and a conducting cone being sequentially located beneath the fluid-cooling gas transmitter, the first and second gas spraying plates changing a flow direction of the third gas, the second and third gas spraying plates changing a flow direction of the second gas, and the third gas spraying plate and the conducting cone changing a flow direction of the first gas.

15. The gas injector and cover plate assembly of claim 14, wherein the first, second and third gas spraying plates comprise gas spraying plates with an inverted cone shape having a disc circular edge, gas spraying plates with an inverted bowl shape having a curvature, or gas spraying plates with a hollow center and a gradually increased thickness from the center to the circumference.

16. The gas injector and cover plate assembly of claim 14, wherein pitches and incline angles between the first gas spraying plate, the second gas spraying plate, the third gas spraying plate and the conducting cone are adjustable.

17. The gas injector and cover plate assembly of claim 14, wherein a top portion of the conducting cone connecting the gas conduit has a plurality of openings.

18. The gas injector and cover plate assembly of claim 14, wherein the connection between the third partition and the fluid-cooling gas transmitter is sealed by a plurality of O rings.

19. The gas injector and cover plate assembly of claim 14, wherein the fluid-cooling gas transmitter is secured on the gas distributor via at least one screw, the first, second and third gas spraying plates are secured on the fluid-cooling gas transmitter via at least one screw.

20. The gas injector and cover plate assembly of claim 14 further comprising a ceiling attached to a surface of the cover plate and adjacent one side of the gas injector.

* * * * *